United States Patent
Wu et al.

(10) Patent No.: US 10,770,496 B2
(45) Date of Patent: Sep. 8, 2020

(54) OPTICAL SENSORS AND METHODS FOR FORMING THE SAME

(71) Applicant: VisEra Technologies Company Limited, Hsin-Chu (TW)

(72) Inventors: Ching-Chiang Wu, Zhubei (TW); Ho-Tai Lin, Hsinchu (TW); Masafumi Sano, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 15/953,837

(22) Filed: Apr. 16, 2018

(65) Prior Publication Data

US 2019/0319059 A1     Oct. 17, 2019

(51) Int. Cl.
*H01L 27/146*      (2006.01)

(52) U.S. Cl.
CPC .. *H01L 27/14623* (2013.01); *H01L 27/14621* (2013.01); *H01L 27/14645* (2013.01); *H01L 27/14685* (2013.01)

(58) Field of Classification Search
CPC ......... H01L 27/14621; H01L 27/14623; H01L 27/14625; H01L 27/14645
USPC ........................................ 257/294, 432, 435
See application file for complete search history.

(56) References Cited

U.S. PATENT DOCUMENTS

| | | |
|---|---|---|
| 2008/0213927 A1 | 9/2008 | Wang et al. |
| 2016/0259095 A1* | 9/2016 | Kim ................. G02B 5/003 |
| 2017/0052405 A1* | 2/2017 | Yu ................... H05K 999/99 |
| 2019/0245011 A1* | 8/2019 | Lius ................ G02F 1/13338 |

FOREIGN PATENT DOCUMENTS

| | | |
|---|---|---|
| CN | 102830859 B | 9/2015 |
| TW | 201543982 A | 11/2015 |
| TW | 201624789 A | 7/2016 |
| TW | 201717447 A | 5/2017 |

* cited by examiner

*Primary Examiner* — Matthew E Warren
(74) *Attorney, Agent, or Firm* — Muncy, Geissler, Olds & Lowe, P.C.

(57) ABSTRACT

An optical sensor includes an optical layer disposed on a substrate, and a light shielding layer disposed on the optical layer, wherein the light shielding layer includes a first opening that partially exposes the optical layer. The optical sensor also includes a polymer material layer that fills the first opening, wherein a top surface of the polymer material layer is higher than a top surface of the light shielding layer. The optical sensor further includes an adhesive layer disposed on the light shielding layer and the polymer material layer, and a surface component disposed on the adhesive layer.

14 Claims, 10 Drawing Sheets

OPTICAL SENSORS AND METHODS FOR FORMING THE SAME

BACKGROUND

Field of the Disclosure

This invention relates to optical sensor technology, and more particularly to optical sensors with a polymer material layer that fills the openings of a light shielding layer.

Description of the Related Art

To capture a color image of a scene, an optical sensor must be sensitive to a broad spectrum of light. The optical sensor reacts to light that is reflected from the scene and can convert the strength of that light into electronic signals. An optical sensor, such as a charge-coupled device (CCD) optical sensor or a complementary metal-oxide semiconductor (CMOS) optical sensor, generally has photoelectric conversion regions that convert incident light into electronic signals. In addition, the optical sensor has logic circuits for transmitting and processing the electronic signals.

Nowadays, optical sensors are widely applied in many fields, as well as in devices such as light sensors, proximity sensors, time-of-flight (TOF) cameras, spectrometers, smart sensors used in the Internet of things (IOT), and sensors for advanced driver assistance systems (ADAS), for example.

Although existing optical sensors have been adequate for their intended purposes, they have not been entirely satisfactory in all respects. Therefore, there are still some problems with optical sensors that remain to be overcome.

BRIEF SUMMARY

In some optical sensors, a light shielding layer is disposed on an optical layer. The light shielding layer includes at least one opening that partially exposes the optical layer, and light can be transmitted to the optical layer through the opening without being blocked by the light shielding layer. However, when a surface component is attached to the light shielding layer through an adhesive layer, air bubbles will be generated between the adhesive layer and the light shielding layer and the air bubbles may be easily trapped in corners of the opening. As a result, the adhesive layer will swell after the thermal process performed subsequently, the optical refractive index of the optical sensor will be affected, and the image quality of the optical sensor will be degraded.

According to embodiments of the disclosure, a polymer material layer is filled into the opening of the light shielding layer, and the top surface of the polymer material layer is higher than the top surface of the light shielding layer. That is, the polymer material layer is protruded from the light shielding layer, and a plurality of channels (i.e. air vents) are formed between the protruding portions of the polymer material layer. Therefore, when the surface component is attached to the light shielding layer by the adhesive layer, the air can be exhausted through the air channels. Therefore, the surface component may be tightly attached to the light shielding layer without any air bubbles trapped between them, which contribute to better image quality of the optical sensor.

In some embodiments of the disclosure, an optical sensor is provided. The optical sensor includes an optical layer disposed on a substrate, and a light shielding layer disposed on the optical layer, wherein the light shielding layer includes a first opening that partially exposes the optical layer. The optical sensor also includes a polymer material layer that fills the first opening, wherein a top surface of the polymer material layer is higher than a top surface of the light shielding layer. The optical sensor further includes an adhesive layer disposed on the light shielding layer and the polymer material layer, and a surface component disposed on the adhesive layer.

In some embodiments of the disclosure, an optical sensor is provided. The optical sensor includes an optical layer disposed on a substrate, and a light shielding layer disposed on the optical layer, wherein the light shielding layer includes a first array of openings and a second array of openings that partially exposes the optical layer. The optical sensor also includes a first polymer material portion that fills the first array of openings, and a second polymer material portion that fills the second array of openings. The optical sensor further includes an adhesive layer disposed on the light shielding layer, the first polymer material portion and the second polymer material portion, wherein the adhesive layer extends between the first polymer material portion and the second polymer material portion. In addition, the optical sensor includes a surface component disposed on the adhesive layer.

In some embodiments of the disclosure, a method for forming an optical sensor is provided. The method includes forming an optical layer on a substrate, and forming a light shielding layer on the optical layer, wherein the light shielding layer includes a first opening and a second opening that partially exposes the optical layer. The method also includes forming a polymer material layer on the optical layer, wherein the polymer material layer has a first portion that fills the first opening and a second portion that fills the second opening, the first portion and the second portion protrude from a top surface of the light shielding layer, and the first portion and the second portion have a space therebetween. The method further includes applying an adhesive layer on the light shielding layer and the polymer material layer, and attaching a surface component to the polymer material layer with the adhesive layer.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein:

FIG. 1A is a cross-sectional view taken along line 1-1' of FIG. 2A. FIG. 1B is a cross-sectional view of the comparative optical sensor taken along line 1-1' of FIG. 2B.

FIG. 3A is a cross-sectional view taken along line 3-3' of FIG. 5A. FIG. 3B is a cross-sectional view taken along line 3-3' of FIG. 5B.

FIG. 4A is a cross-sectional view taken along line 4-4' of FIG. 6.

DETAILED DESCRIPTION OF THE INVENTION

The following description is of the contemplated mode of carrying out the disclosure. This description is made for the purpose of illustrating the general principles of the disclosure and should not be taken in a limiting sense. The scope of the disclosure is best determined by reference to the appended claims.

Figure 1A:
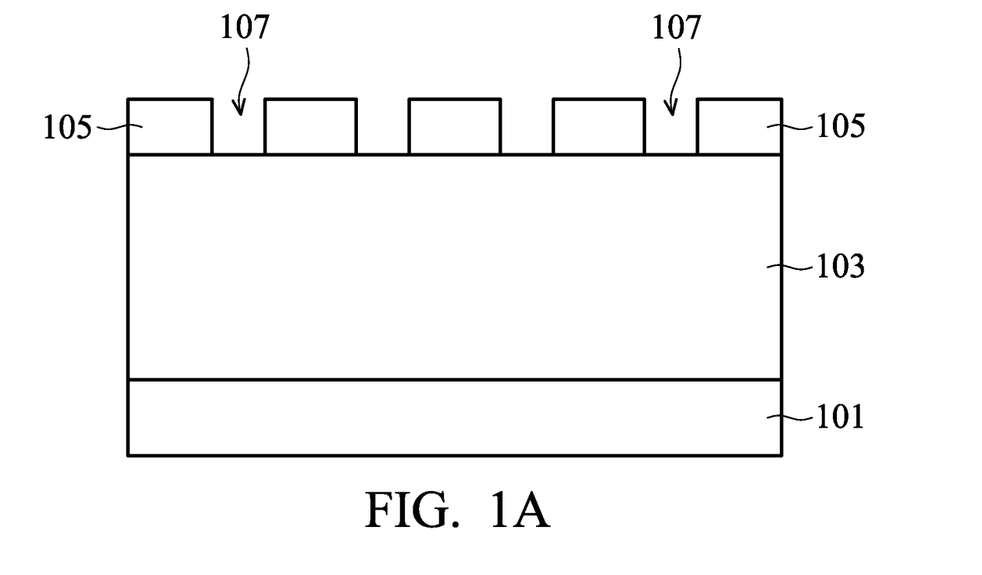
FIGS. 1A-1B are cross-sectional views illustrating an exemplary sequential forming process of a comparative optical sensor.
Figure 1B:
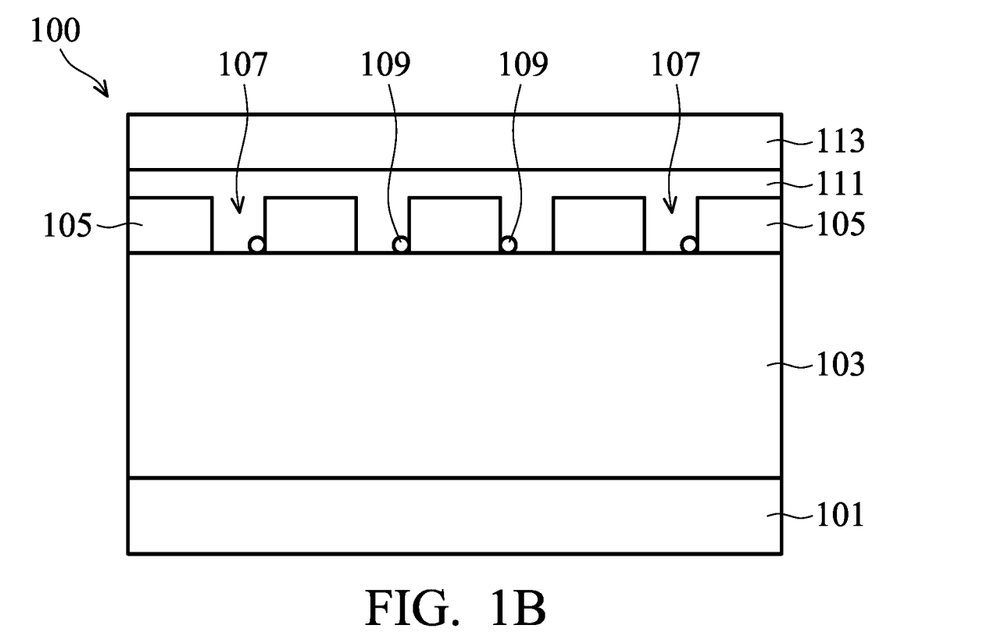
Figure 2A:
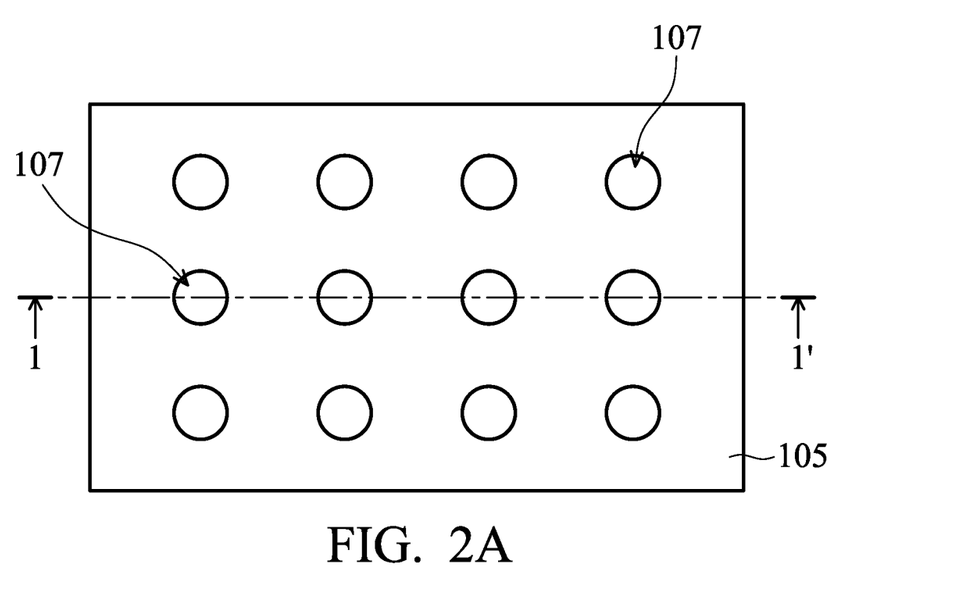
FIGS. 2A-2B are top views of the exemplary sequential forming process of the comparative optical sensor shown in FIGS. 1A-1B.
Figure 2B:
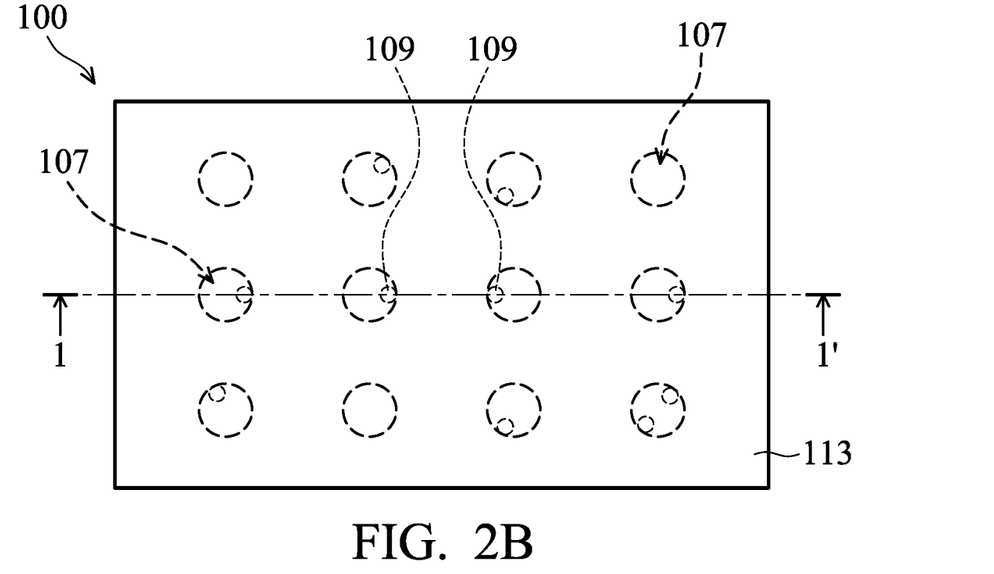

FIGS. 1A-1B are cross-sectional views illustrating an exemplary sequential forming process of a comparative optical sensor 100. FIGS. 2A-2B are top views of the exemplary sequential forming process of the comparative optical sensor 100 shown in FIGS. 1A-1B. FIG. 1A is a cross-sectional view taken along line 1-1' of FIG. 2A. FIG. 1B is a cross-sectional view of the comparative optical sensor 100 taken along line 1-1' of FIG. 2B.

As shown in FIGS. 1A and 2A, an optical layer 103 is located on a substrate 101, and a light shielding layer 105 is located on the optical layer 103. The light shielding layer 105 has a plurality of openings 107 that partially exposes the optical layer 103. The openings 107 are disconnected from each other. That is, referring to FIG. 2A, each of the openings 107 is enclosed by the light shielding layer 105.

Next, as shown in FIGS. 1B and 2B, a surface component 113 is attached to the light shielding layer 105 by an adhesive layer 111. Since each of the openings 107 is enclosed by the light shielding layer 105, a plurality of air bubbles 109 are generated between the adhesive layer 111 and the light shielding layer 105 and are trapped in the corners of the openings 107. As a result, the adhesive layer 111 swell after the thermal process performed subsequently, the optical refractive index of the optical sensor 100 is affected (e.g. deviated from the expected value), and the image quality of the optical sensor 100 is degraded.

Figure 3A:
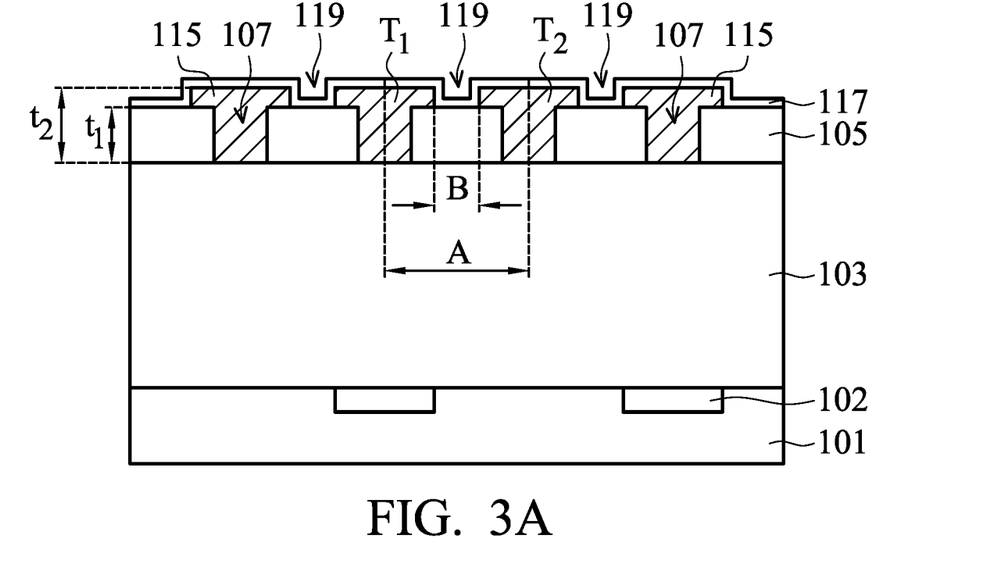
FIGS. 3A-3D are cross-sectional views illustrating an exemplary sequential forming process of an optical sensor in accordance with some embodiments of the present disclosure.
Figure 3B:
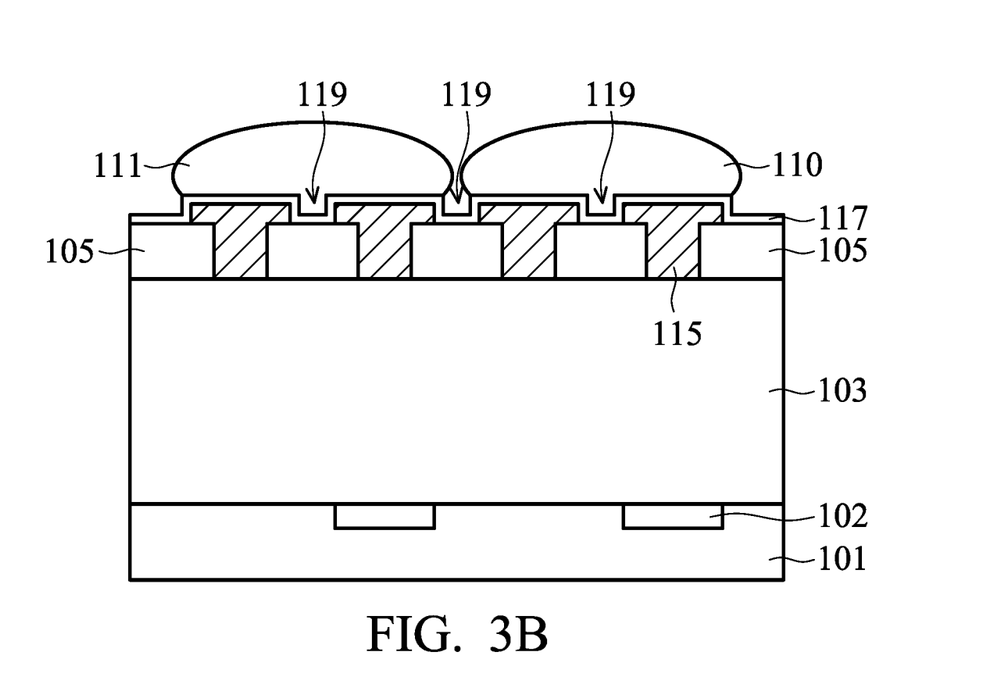
Figure 5A:
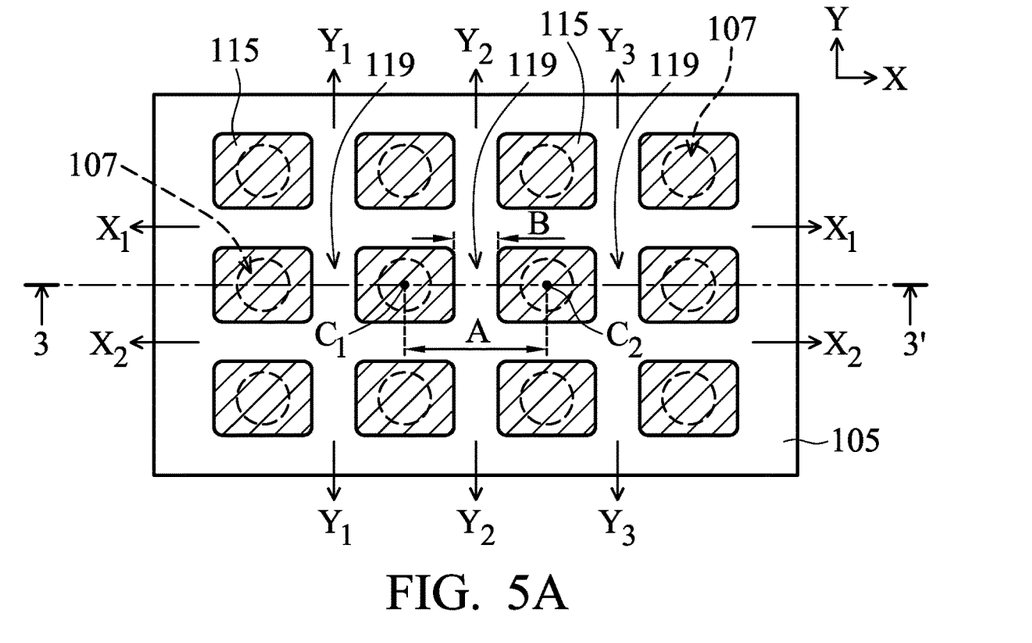
FIGS. 5A-5B are top views corresponding to cross-sectional views of FIGS. 3A-3B in accordance with some embodiments of the present disclosure.
Figure 5B:
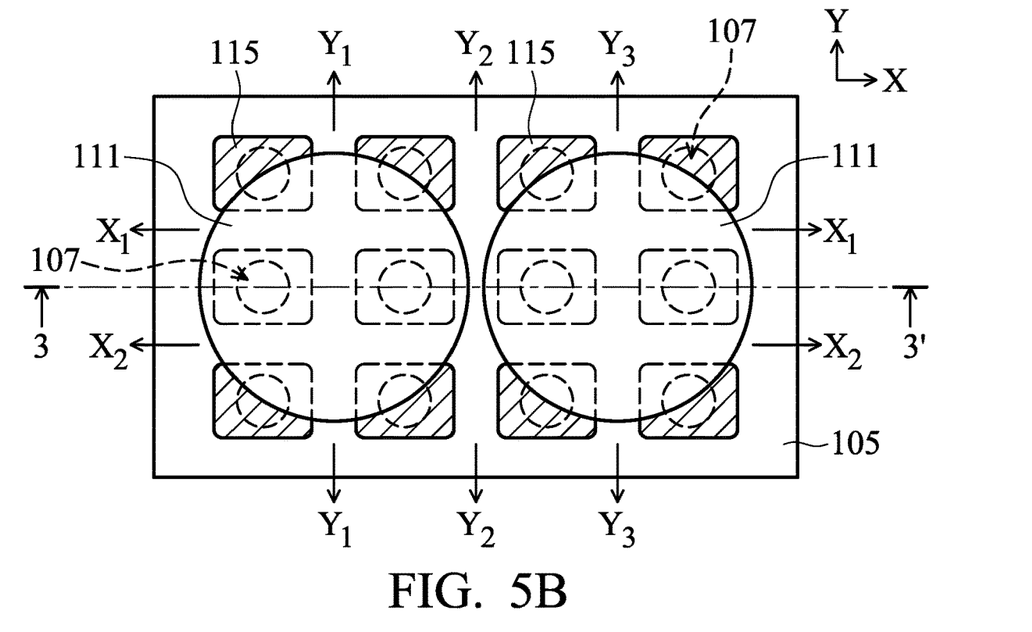

FIGS. 3A-3D are cross-sectional views illustrating an exemplary sequential forming process of an optical sensor 200a in accordance with some embodiments of the present disclosure. FIGS. 5A-5B are top views corresponding to cross-sectional views of FIGS. 3A-3B in accordance with some embodiments of the present disclosure. FIG. 3A is a cross-sectional view taken along line 3-3' of FIG. 5A. FIG. 3B is a cross-sectional view taken along line 3-3' of FIG. 5B.

Referring to FIG. 3A, an optical layer 103 is formed on a substrate 101, and the substrate 101 has a plurality of photoelectric conversion regions 102. In some embodiments, the substrate 101 may be a semiconductor substrate, for example, a silicon wafer or a chip, and each of the photoelectric conversion regions 102 may include a photoelectric conversion element, such as a photodiode (PD). Although FIG. 3A shows only two photoelectric conversion regions 102, it should be noted that there is no limitation on the number of the photoelectric conversion regions 102 formed in the substrate 101, and the photoelectric conversion regions 102 are surrounded by the peripheral circuit region (not shown).

The photoelectric conversion regions 102 are formed on a surface of the substrate 101. In some embodiments, a wiring layer (not shown) of various wiring lines and electronic circuits required for the optical sensor 200a formed subsequently is formed on the opposite surface of the substrate 101.

In some embodiments, the optical layer 103 may be a material structure with some conductive layers and dielectric layers (such as interlayer dielectric (ILD) layers, inter-metal dielectric (IMD) layers) therein, and the conductive layers in the optical layer 103 may be a wiring structure required for the optical sensor 200a formed subsequently. Moreover, the optical layer 103 may include some apertures that light can pass through, and some light shielding layers which are used to block the transmission of light.

Referring to FIGS. 3A and 5A, a light shielding layer 105 is formed on the optical layer 103. Similar to FIGS. 1A and 2A, the light shielding layer 105 has a plurality of openings 107 that partially exposes the optical layer 103. The openings 107 are disconnected from each other. That is, referring to FIG. 5A, each of the openings 107 is enclosed by the light shielding layer 105.

Specifically, each of the openings 107 individually aligned with one photoelectric conversion region 102 in the substrate 101. In some embodiments, the light shielding layer 105 is used to reduce or prevent cross-talk caused by an oblique incident light radiating onto the optical sensor 200a formed subsequently so that the sensitivity of the optical sensor 200a can be improved.

In some embodiments, in the peripheral circuit region surrounding the photoelectric conversion regions 102, the optical layer 103 may not be exposed by any of the openings 107. In such cases, the polymer material layer 115 subsequently formed on the light shielding layer 105 may extend to the edges of the peripheral circuit region.

Still referring to FIGS. 3A and 5A, a polymer material layer 115 is formed on the optical layer 103 and fills the openings 107. It should be noted that the top surface of the polymer material layer 115 is higher than the top surface of the light shielding layer 105. That is, the polymer material layer 115 protrudes from the top surface of the light shielding layer 105.

In some embodiments, the polymer material layer 115 may be made of an organic polymer (such as a flowable photoresist), and the polymer material layer 115 may be formed by a deposition or coating process and followed by a patterning process. The patterning process includes a photolithography process and an etching process.

Moreover, the polymer material layer 115, which is made of an organic polymer, allows the full-spectrum light or specific wavelengths of light to pass through. If the polymer material layer 115 are designed to transmit light in full wavelength range (i.e. full-spectrum light), the polymer material layer 115 may be made of a transparent organic polymer. If the polymer material layer 115 is designed to transmit light in a specific wavelength range, the polymer material layer 115 may be made of a red color filter, a green color filter, a blue color filter, a cyan color filter, a magenta color filter, a yellow color filter, or an infrared (IR) pass filter according to the device requirements.

In some other embodiments, if the polymer material layer 115 is not designed to transmit light, the polymer material layer 115 may be made of a non-transparent organic polymer. Since the openings 107 are aligned with the photoelectric conversion regions 102, the portions of the polymer material layer 115 that fill the openings 107 are also aligned with the photoelectric conversion regions 102.

Specifically, the polymer material layer 115 has several individual protruding portions that fill different openings 107 in the light shielding layer 105. Every two protruding portions of the polymer material layer 115 are disconnected with each other and have a space 119 between them. In some embodiments, the polymer material layer 115 has individual protruding portions which further extend on the light shielding layer 105. As shown in FIG. 3A, the protruding portions of the polymer material layer 115 have spaced T-shaped cross-sections.

In more detail, the protruding portions of the polymer material layer 115 extend on the light shielding layer 105, such that the portion of the light shielding layer 105 close to the opening 107 filled by the polymer material layer 115 is covered by the polymer material layer 115. Specifically, referring to FIG. 3A, the polymer material layer 115 has a first T-shaped cross-section $T_1$ and a second T-shaped cross-section $T_2$, and the first T-shaped cross-section $T_1$ is separated from the second T-shaped cross-section $T_2$. That is, the first T-shaped cross-section $T_1$ and the second T-shaped cross-section $T_2$ are two disconnected portions of the polymer material layer 115.

In some embodiments, the first T-shaped cross-section $T_1$ has a first center $C_1$ and the second T-shaped cross-section $T_2$ has a second center $C_2$ in the top view of FIG. 5A. The first center $C_1$ and the second center $C_2$ have a first distance A between them. Moreover, the first T-shaped cross-section $T_1$ and the second T-shaped cross-section $T_2$ have a second distance B between them. The second distance B is the shortest distance between the first T-shaped cross-section $T_1$ and the second T-shaped cross-section $T_2$. In some embodiments, the ratio of the second distance B to the first distance A is in a range from about 15% to about 85%. If the ratio of the second distance B to the first distance A is smaller than 15% or greater than 85%, the air bubbles trapped between the light shielding layer 105 and the adhesive layer formed subsequently may not be exhausted efficiently.

However, in some other embodiments, the light shielding layer 105 may not be covered by the polymer material layer 115, and the light shielding layer 105 and the polymer material layer 115 do not overlap with each other.

In addition, as shown in FIG. 5A, each of the protruding portions of the polymer material layer 115 fills in one of the openings 107. However, in other embodiments, each of the protruding portions of the polymer material layer 115 may fill in more than one of the openings 107, and the arrangement of the protruding portions of the polymer material layer 115 may be adjusted according to actual process requirements.

Moreover, the optical layer 103 is fully covered by the polymer material layer 115 and the light shielding layer 105. In addition, the light shielding layer 105 has a thickness $t_1$, and the polymer material layer 115 has a thickness $t_2$. In some embodiments, the thickness $t_2$ is at least greater than the thickness $t_1$, and the thickness $t_2$ is less than about 1.5 times the thickness $t_1$. For example, the thickness $t_1$ is about 1.5 µm, and the thickness $t_2$ is about 2 µm.

Referring again to FIG. 3A, a hydrophilic film 117 may be optionally formed covering the light shielding layer 105 and the polymer material layer 115. Specifically, the hydrophilic film 117 is formed conformally on the light shielding layer 105 and the polymer material layer 115, and the hydrophilic film 117 extends into the spaces 119. In some embodiments, the hydrophilic film 117 is made of an inorganic material. In some other embodiments, the hydrophilic film 117 may be made of an organic material.

The contact angles between the hydrophilic film 117 and the adhesive layer 111 formed subsequently (as shown in FIG. 3B) are smaller than the contact angles between the polymer material layer 107 and the adhesive layer 111, and the contact angles between the hydrophilic film 117 and the adhesive layer 111 are smaller than the contact angles between the light shielding layer 105 and the adhesive layer 111. Therefore, by forming the hydrophilic film 117, the adhesive layer 111 can be spread uniformly, and the impurities attached on the hydrophilic film 117 can be removed easily.

Referring to FIG. 5A, the polymer material layer 115 has several protruding portions, and the spaces 119 between the protruding portions of the polymer material layer 115 together form a plurality of channels (i.e. air vents). The channels $X_1$ and $X_2$ are parallel to the X-axis, and the channels $Y_1$, $Y_2$ and $Y_3$ are parallel to the Y-axis.

In some embodiments, the protruding portions of the polymer material layer 115 have similar rectangular shapes. Although FIG. 5A shows only twelve protruding portions of the polymer material layer 115, it should be noted that there is no limitation on the number of the protruding portions of the polymer material layer 115. To simplify the diagram, the hydrophilic film 117 is not shown in FIG. 5A.

Next, referring to FIGS. 3B and 5B, a plurality of adhesive droplets 110 are applied on the light shielding layer 105 and the polymer material layer 115. In some embodiments, the adhesive droplets 110 may be transparent glue.

Figure 3C:
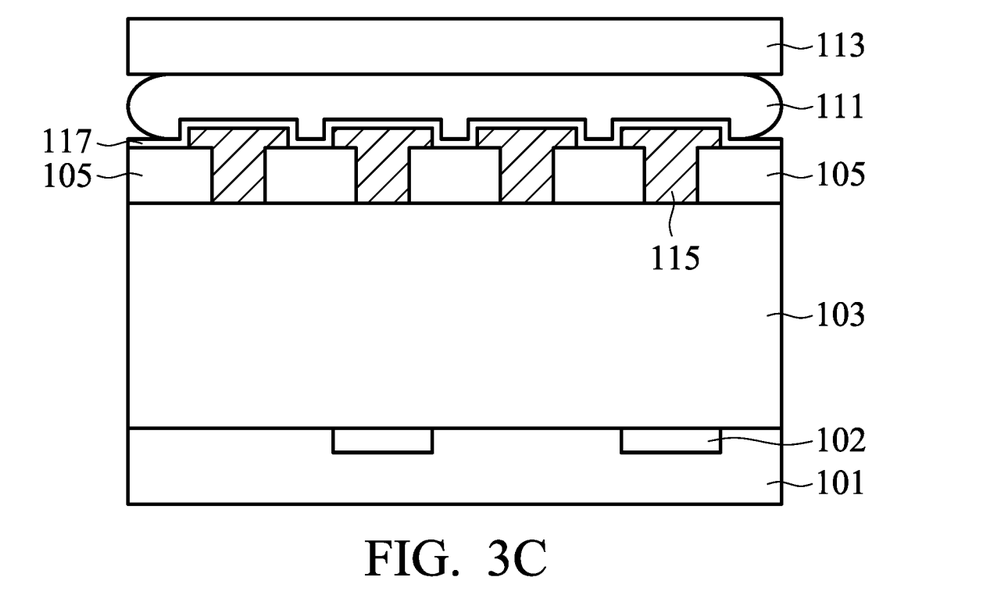

Then, referring to FIG. 3C, a surface component 113 is disposed on the adhesive droplets 110, and the adhesive droplets 110 combined into an adhesive layer 111. In some embodiments, the surface component 113 is partially transparent or fully transparent. For example, if the surface component 113 is designed to transmit light in full wavelength range (i.e. full-spectrum light), the surface component 113 may be fully transparent. If the surface component 113 is designed to transmit light in a specific wavelength range, the surface component 113 may be partially transparent, for example, the surface component 113 may include an ultraviolet (UV)/infrared (IR) cut filter, an UV/IR pass filter, or a narrow band pass filter (e.g. light with a wavelength of 850 nm or 940 nm can be transmitted). The surface component 113 may be any suitable material, including, but not limited to, glass, plastic, acrylic, sapphire, or a combination thereof. The material of the surface component 113 may be selected according to its optical phenomena. In addition, the surface component 113 may be a single layer or multiple layers.

Figure 3D:
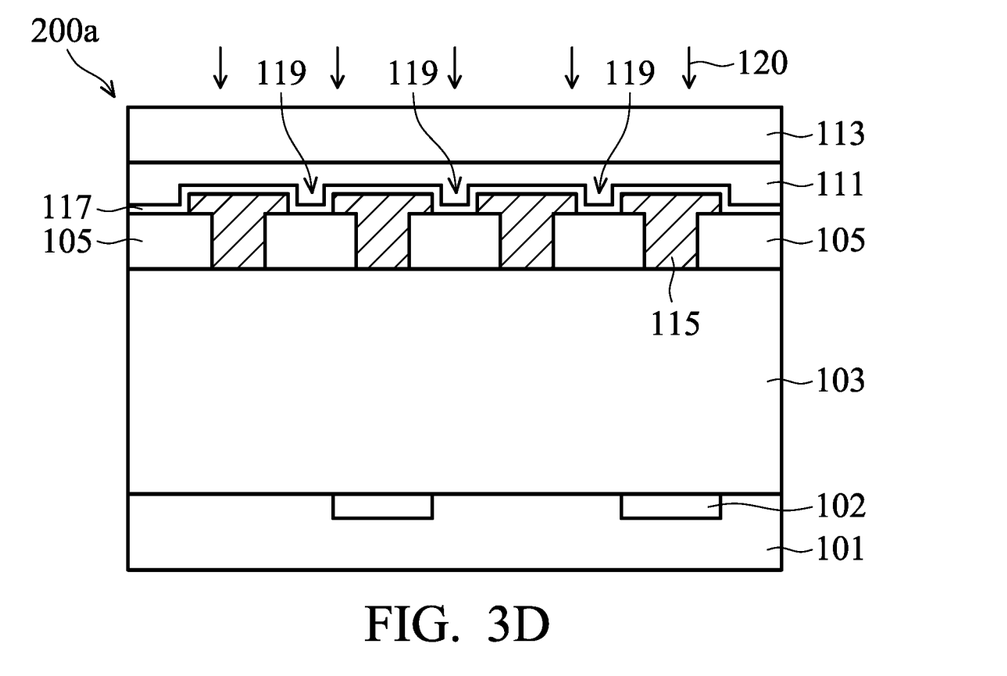

Referring to FIG. 3D, after placing the surface component 113, a force 120 is applied to the surface component 113 uniformly so that air bubbles trapped between the adhesive layer 111 and the light shielding layer 105 are removed through the spaces 119, and the spaces 119 are entirely filled by the adhesive layer 111. It should be noted that the air bubbles trapped between the adhesive layer 111 and the light shielding layer 105 can be removed through the channels $X_1$, $X_2$, $Y_1$, $Y_2$ and $Y_3$ which are shown in the top view of FIG. 5A. Once the force 120 is applied, the surface component 113 is tightly attached to the polymer material layer 115 by the adhesive layer 111, and the optical sensor 200a is complete.

Moreover, in some embodiments, the polymer material layer 115 is surrounded by the adhesive layer 111 and the light shielding layer 105. Since the adhesive layer 111 extends into the space 119 between the protruding portions of the polymer material layer 115, the top surface of the polymer material layer 115 is higher than the bottommost surface of the adhesive layer.

In the optical sensor 200a, the adhesive layer 111 is separated from the light shielding layer 105 and the polymer material layer 115 by the hydrophilic film 117, and the bottom surface of the adhesive layer 111 is higher than the top surface of the light shielding layer 105. In some other embodiments, if the hydrophilic film 117 is not formed in the optical sensor 200a, the bottom surface of the adhesive layer is in contact with the top surface of the light shielding layer 105.

Figure 4A:
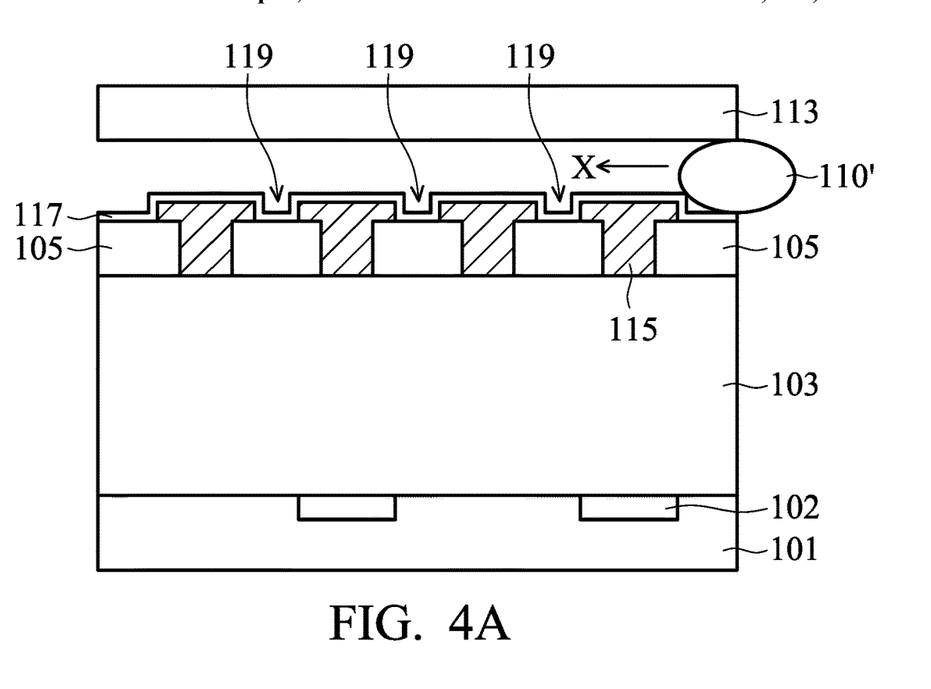
FIGS. 4A-4B are cross-sectional views illustrating an exemplary sequential forming process of an optical sensor in accordance with some embodiments of the present disclosure.
Figure 4B:
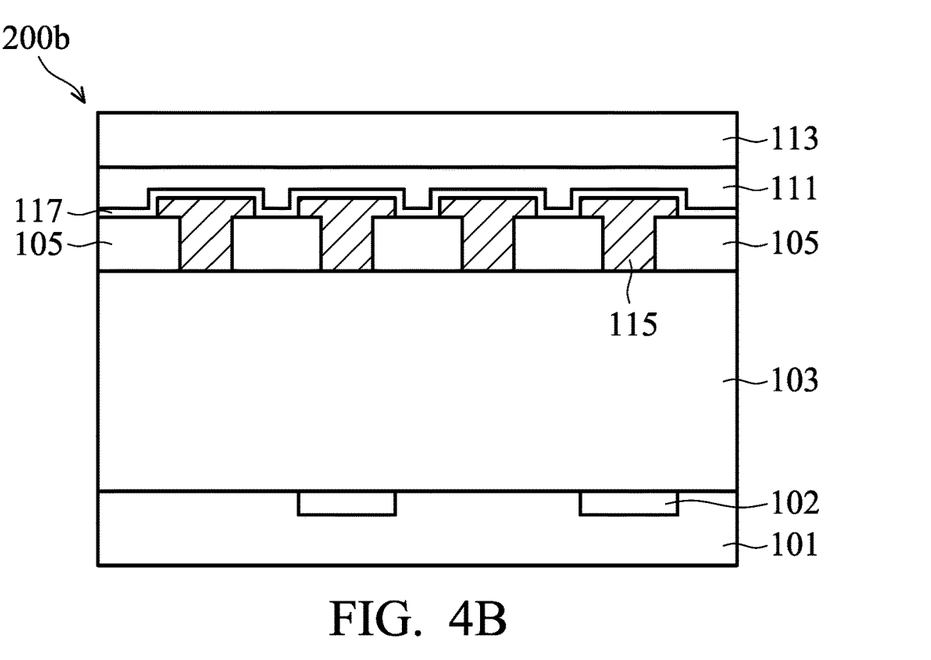
Figure 6:
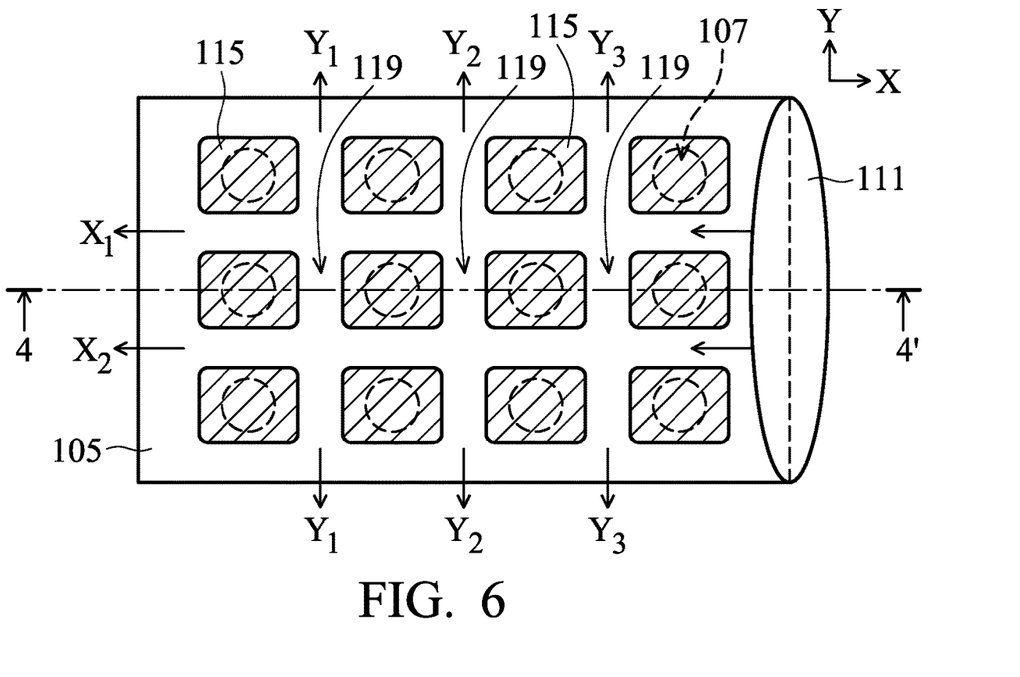
FIG. 6 is a top view corresponding to the cross-sectional view of FIG. 4A in accordance with some embodiments of the present disclosure.

FIGS. 4A-4B are cross-sectional views illustrating an exemplary sequential forming process of an optical sensor 200b in accordance with some embodiments of the present disclosure. FIG. 6 is a top view corresponding to cross-sectional view of FIG. 4A in accordance with some embodiments of the present disclosure. FIG. 4A is a cross-sectional view taken along line 4-4' of FIG. 6.

Components of the optical sensor 200b are similar to those of the optical sensor 200a shown in FIG. 3D and are not repeated herein for simplicity. The difference between the sequential forming processes of the optical sensor 200a and the optical sensor 200b is the forming method of the adhesive layer 111. Continued from FIG. 3A, as shown in FIGS. 4A and 6, an adhesive material 110' is applied between the light shielding layer 105, the polymer material layer 115 and the surface component 113 from an edge of the substrate 101 via capillary action.

Specifically, the adhesive material 110' flows between the hydrophilic film 117 and the surface component 113 along the X-axis without the assistance of external forces. While the adhesive material 110' flows along the X-axis to form the adhesive layer 111 between the hydrophilic film 117 and the surface component 113, the air bubbles trapped between the adhesive material 110' (or the adhesive layer 111 formed subsequently) and the light shielding layer 105 can be removed through the spaces 119, and the spaces 119 can be entirely filled by the adhesive layer 111.

It should be noted that the air bubbles trapped between the adhesive material 110' and the light shielding layer 105 can be removed through the channels $X_1$, $X_2$, $Y_1$, $Y_2$ and $Y_3$ which are shown in the top view of FIG. 6. As a result, as shown in FIG. 4B, the optical sensor 200b is complete. In addition, the flow direction of the adhesive material 110' is not limited to the X-axis. In some other embodiments, the adhesive material 110' can be provided from any edge of the substrate 101, and the adhesive material 110' may be adjusted to flow along any direction.

Figure 7A:
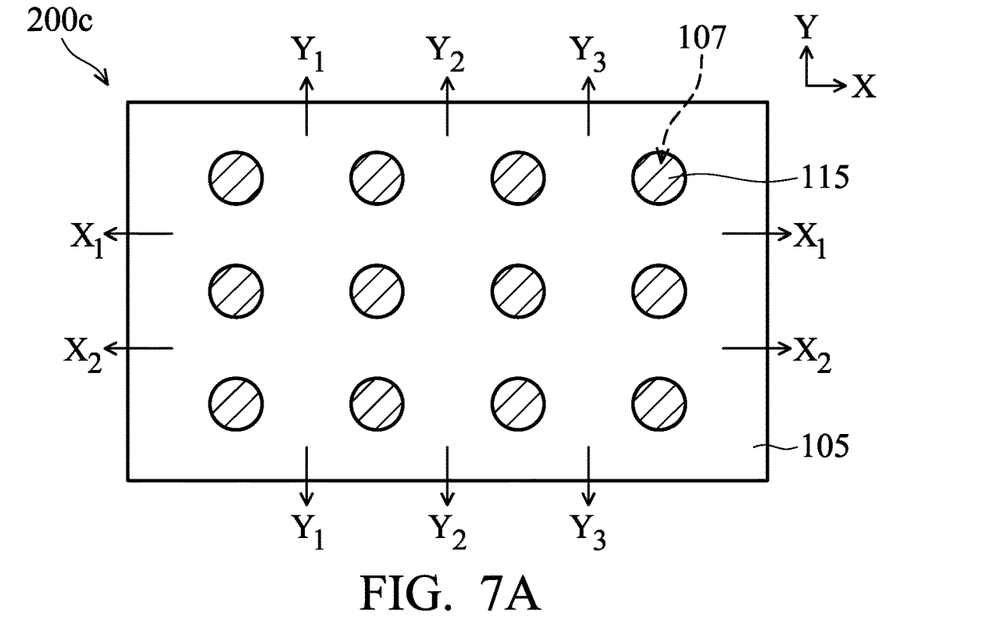
FIG. 7A is a top view of an optical sensor in accordance with some embodiments of the present disclosure.

FIG. 7A is a top view of an optical sensor 200c in accordance with some embodiments of the present disclosure. Components of the optical sensor 200c are similar to those of the optical sensor 200a shown in FIG. 3D and are not repeated herein for simplicity. The difference between the optical sensor 200a and the optical sensor 200c is the shapes of the protruding portions of the polymer material layer 115 from a top view.

Referring to FIG. 7A, the protruding portions of the polymer material layer 115 have similar circular shapes. Moreover, the polymer material layer 115 does not cover any portions of the light shielding layer 105. Therefore, the area of each protruding portions of the polymer material layer 115 from the top view of FIG. 7A is the same as the area of each of the openings 107 in the light shielding layer 105.

Figure 7B:
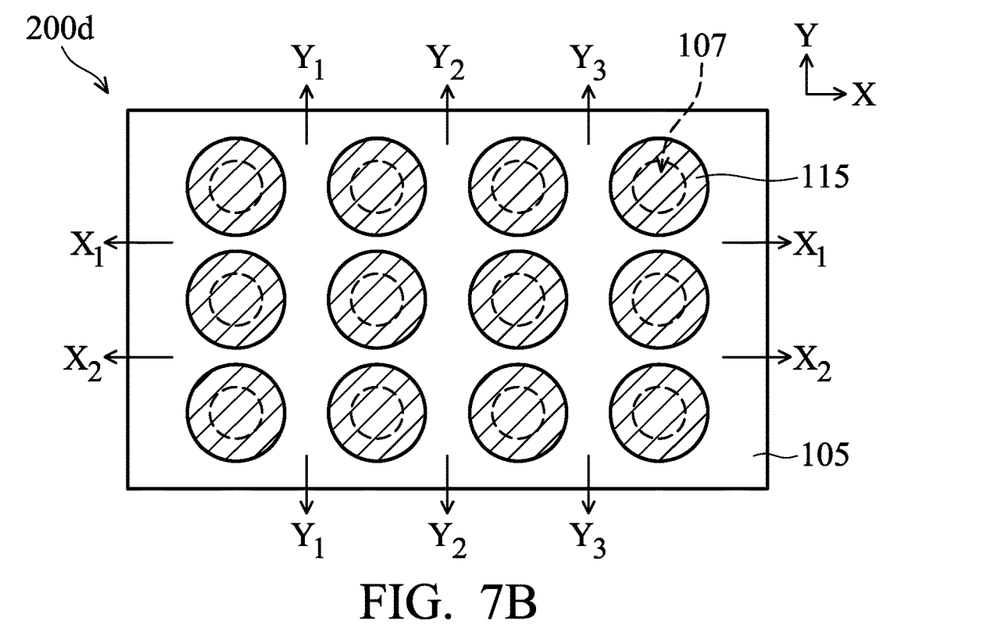
FIG. 7B is a top view of an optical sensor in accordance with some embodiments of the present disclosure.

FIG. 7B is a top view of an optical sensor 200d in accordance with some embodiments of the present disclosure. Components of the optical sensor 200d are similar to those of the optical sensor 200a shown in FIG. 3D and are not repeated herein for simplicity. The difference between the optical sensor 200a and the optical sensor 200d is the shapes of the protruding portions of the polymer material layer 115 from a top view.

Referring to FIG. 7B, the protruding portions of the polymer material layer 115 have similar circular shapes. In some other embodiments, the shapes of each protruding portions of the polymer material layer 115 in an optical sensor may not be similar.

Figure 7C:
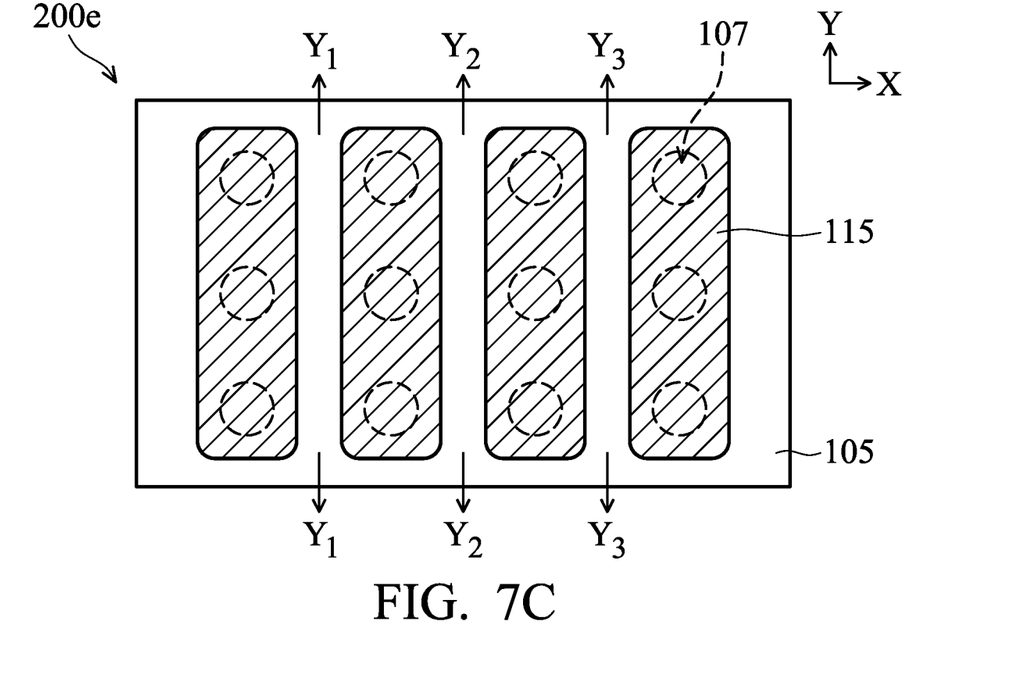
FIG. 7C is a top view of an optical sensor in accordance with some embodiments of the present disclosure.

FIG. 7C is a top view of an optical sensor 200e in accordance with some embodiments of the present disclosure. Components of the optical sensor 200e are similar to those of the optical sensor 200a shown in FIG. 3D and are not repeated herein for simplicity. The difference between the optical sensor 200a and the optical sensor 200d is the arrangement of the protruding portions of the polymer material layer 115 from a top view.

Referring to the top view of FIG. 7C, the protruding portions of the polymer material layer 115 in the same column along the Y-axis are connected to each other. Specifically, there are four rectangular portions of the polymer material layer 115 disposed parallel to each other, and none of them extends to the edges of the light shielding layer 105. As a result, the channels $Y_1$, $Y_2$ and $Y_3$ which are parallel to the Y-axis are formed between the four rectangular portions of the polymer material layer 115.

Figure 7D:
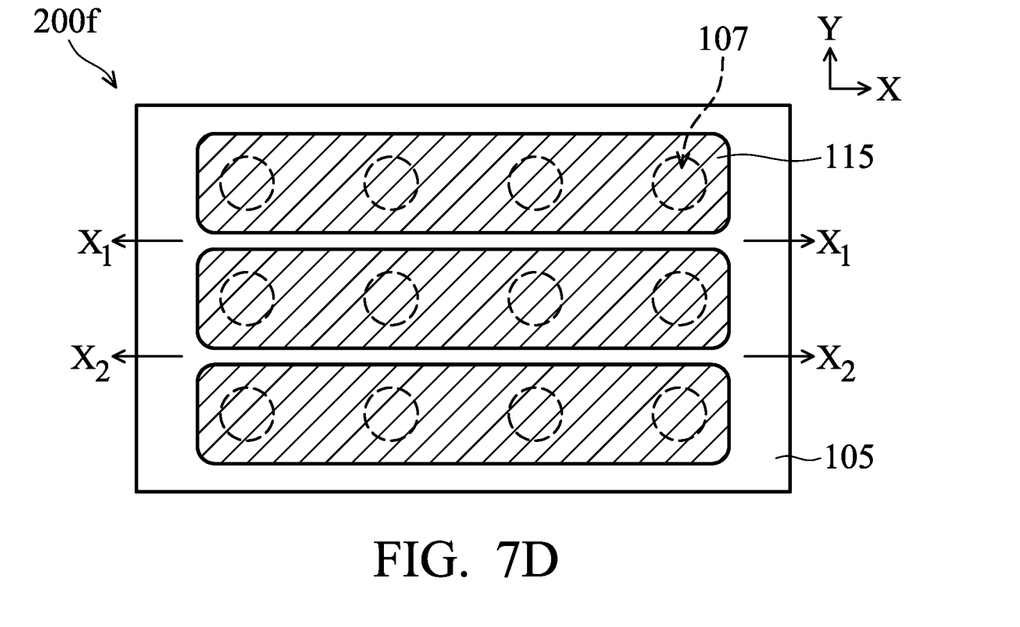
FIG. 7D is a top view of an optical sensor in accordance with some embodiments of the present disclosure.

FIG. 7D is a top view of an optical sensor 200f in accordance with some embodiments of the present disclosure. Components of the optical sensor 200f are similar to those of the optical sensor 200a shown in FIG. 3D and are not repeated herein for simplicity. The difference between the optical sensor 200a and the optical sensor 200f is the arrangement of the protruding portions of the polymer material layer 115 from a top view.

Referring to the top view of FIG. 7D, the protruding portions of the polymer material layer 115 in the same row along the X-axis are connected to each other. Specifically, there are three rectangular portions of the polymer material layer 115 disposed parallel to each other, and none of them extends to the edges of the light shielding layer 105. As a result, the channels $X_1$ and $X_2$ which are parallel to the X-axis are formed between the three rectangular portions of the polymer material layer 115.

Figure 7E:
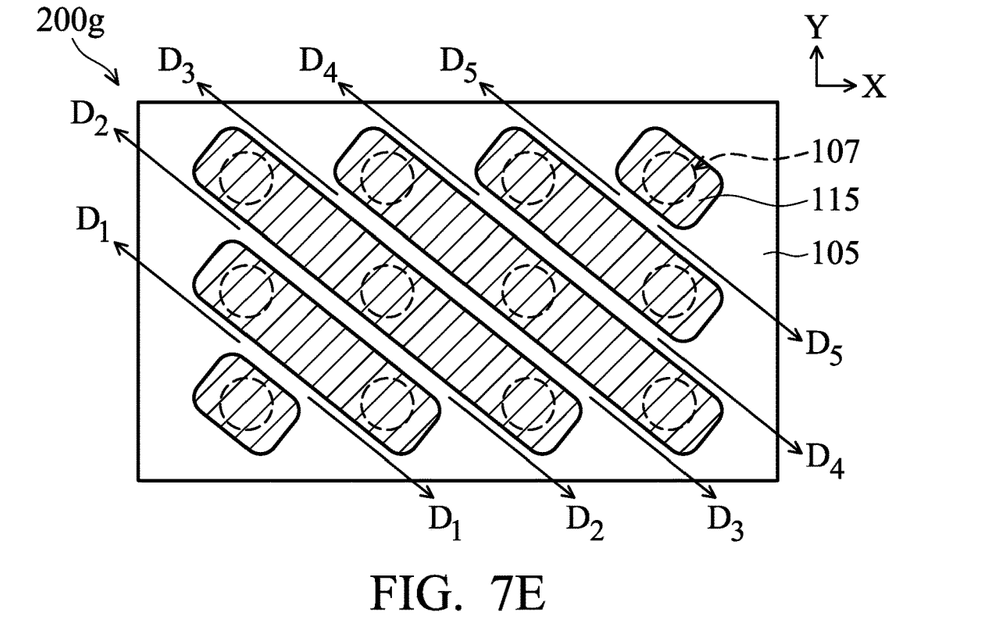
FIG. 7E is a top view of an optical sensor in accordance with some embodiments of the present disclosure.

FIG. 7E is a top view of an optical sensor 200g in accordance with some embodiments of the present disclosure. Components of the optical sensor 200g are similar to those of the optical sensor 200a shown in FIG. 3D and are not repeated herein for simplicity. The difference between the optical sensor 200a and the optical sensor 200g is the arrangement of the protruding portions of the polymer material layer 115 from a top view.

Referring to the top view of FIG. 7E, the protruding portions of the polymer material layer 115 in the same oblique direction are connected to each other. In some embodiments, the oblique direction has an angle of about 22.5 to 67.5 degrees measured clockwise from the positive X-axis. Specifically, there are six rectangular portions of the polymer material layer 115 disposed parallel to each other. As a result, a plurality of channels $D_1$, $D_2$, $D_3$, $D_4$ and $D_5$ which are parallel to each other are formed between the six rectangular portions of the polymer material layer 115.

Figure 7F:
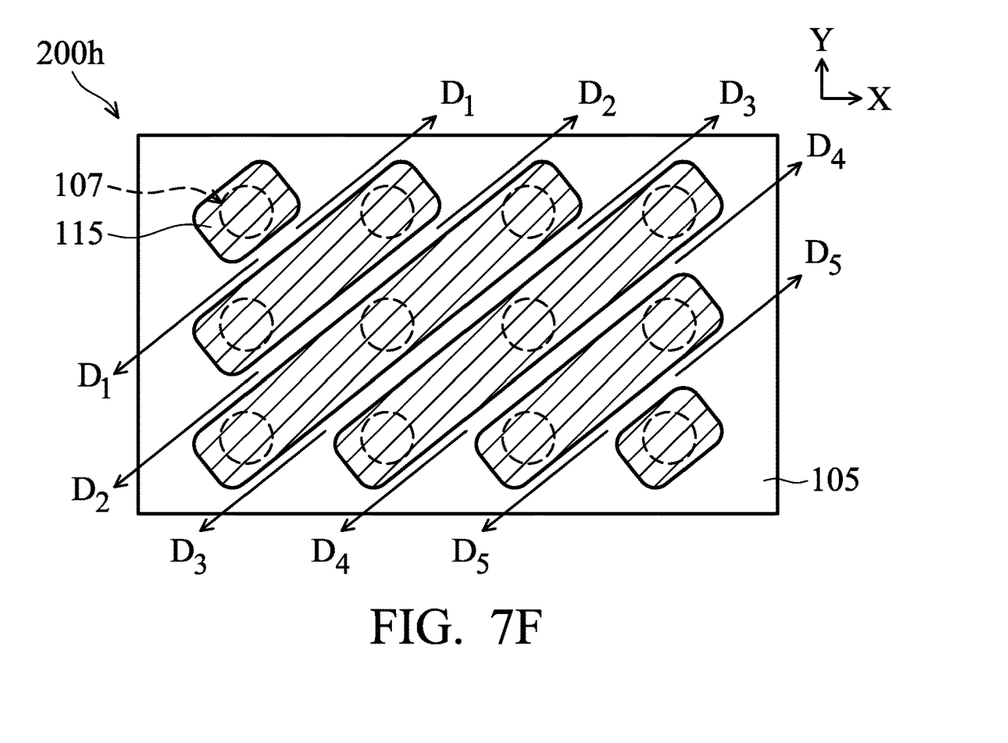
FIG. 7F is a top view of an optical sensor in accordance with some embodiments of the present disclosure.

FIG. 7F is a top view of an optical sensor 200h in accordance with some embodiments of the present disclosure. Components of the optical sensor 200h are similar to those of the optical sensor 200a shown in FIG. 3D and are not repeated herein for simplicity. The difference between the optical sensor 200a and the optical sensor 200h is the arrangement of the protruding portions of the polymer material layer 115 from a top view.

Referring to the top view of FIG. 7F, the protruding portions of the polymer material layer 115 in the same oblique direction are connected to each other. In some embodiments, the oblique direction has an angle of about 22.5 to 67.5 degrees measured counterclockwise from the positive X-axis. Specifically, there are six rectangular portions of the polymer material layer 115 disposed parallel to each other. As a result, a plurality of channels $D_1$, $D_2$, $D_3$, $D_4$ and $D_5$ which are parallel to each other are formed between the six rectangular portions of the polymer material layer 115.

In some optical sensors, a light shielding layer is disposed on an optical layer. The light shielding layer includes at least one opening that partially exposes the optical layer, and light can be transmitted to the optical layer through the opening without being blocked by the light shielding layer. However, when a surface component is attached to the light shielding layer through an adhesive layer, air bubbles will be generated between the adhesive layer and the light shielding layer and the air bubbles may be easily trapped in corners of the opening. As a result, the adhesive layer will swell after the thermal process performed subsequently, the optical refractive index of the optical sensor will be affected, and the image quality of the optical sensor will be degraded.

According to embodiments of the disclosure, a polymer material layer fills the opening of the light shielding layer, and a top surface of the polymer material layer is higher than a top surface of the light shielding layer. That is, the polymer material layer is protruded from the light shielding layer, and a plurality of channels (i.e. air vents) are formed between the protruding portions of the polymer material layer. Therefore, when the surface component is attached to the light shielding layer by the adhesive layer, the air can be exhausted through the air channels. Therefore, the surface component may be tightly attached to the light shielding layer without any air bubbles trapped between them, which contribute to better image quality of the optical sensor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical sensor, comprising:
an optical layer disposed on a substrate;
a light shielding layer disposed on the optical layer, wherein the light shielding layer comprises first openings that partially expose the optical layer;
a polymer material layer fills the first opening, wherein a top surface of the polymer material layer is higher than a top surface of the light shielding layer, wherein the polymer material layer includes a plurality of protruding portions that respectively fill each of the first openings in the light shielding layer, and the plurality of protruding portions of the polymer material layer are disconnected to each other;
an adhesive layer disposed on the light shielding layer and the polymer material layer; and
a surface component disposed on the adhesive layer.

2. The optical sensor as claimed in claim 1, wherein a portion of the light shielding layer is covered by the polymer material layer, and the polymer material layer is surrounded by the adhesive layer and the light shielding layer.

3. The optical sensor as claimed in claim 1, wherein the optical layer is fully covered by the polymer material layer and the light shielding layer.

4. The optical sensor as claimed in claim 1, wherein the polymer material layer has a rectangular shape or a circular shape from a top view.

5. The optical sensor as claimed in claim 1, wherein a thickness of the polymer material layer is less than 1.5 times a thickness of the light shielding layer.

6. The optical sensor as claimed in claim 1, wherein the top surface of the polymer material layer is higher than a bottom surface of the adhesive layer.

7. The optical sensor as claimed in claim 1, further comprising:
a hydrophilic film covering the light shielding layer and the polymer material layer, wherein the adhesive layer is separated from the light shielding layer and the polymer material layer by the hydrophilic film.

8. The optical sensor as claimed in claim 1, further comprising:
a photoelectric conversion region disposed in the substrate,
wherein the polymer material layer is made of an organic polymer, and the polymer material layer is aligned with the photoelectric conversion region, and
wherein the adhesive layer is transparent, and the surface component is partially transparent or fully transparent.

9. The optical sensor as claimed in claim 8, wherein the polymer material layer is made of a transparent organic polymer, a red color filter, a green color filter, a blue color filter, a cyan color filter, a magenta color filter, a yellow color filter, or an infrared pass filter.

10. An optical sensor, comprising:
an optical layer disposed on a substrate;
a light shielding layer disposed on the optical layer, wherein the light shielding layer comprises a first array of openings and a second array of openings that partially exposes the optical layer;
a first polymer material portion fills the first array of openings;
a second polymer material portion fills the second array of openings;
an adhesive layer disposed on the light shielding layer, the first polymer material portion and the second polymer material portion, wherein the adhesive layer extends between the first polymer material portion and the second polymer material portion; and
a surface component disposed on the adhesive layer.

11. The optical sensor as claimed in claim 10, wherein the first polymer material portion is parallel to the second polymer material portion.

12. The optical sensor as claimed in claim 11, wherein the first polymer material portion and the second polymer material portion are disposed along a direction of an edge of the substrate.

13. The optical sensor as claimed in claim 10, wherein the first polymer material portion and the second polymer material portion extend on the light shielding layer, and wherein the first polymer material portion has a first T-shaped cross-section, the second polymer material portion has a second T-shaped cross-section, and the first T-shaped cross-section is separated from the second T-shaped cross-section.

14. The optical sensor as claimed in claim 13, wherein the first T-shaped cross-section has a first center in a top view, the second T-shaped cross-section has a second center in the top view, and the first center and the second center have a first distance therebetween, and wherein the first T-shaped cross-section and the second T-shaped cross-section have a second distance therebetween, and a ratio of the second distance to the first distance is in a range from 15% to 85%.

\* \* \* \* \*